United States Patent [19]

Fernandez

[11] Patent Number: 4,611,196

[45] Date of Patent: Sep. 9, 1986

[54] PIPELINED SUCCESSIVE APPROXIMATION ANALOG-TO-DIGITAL CONVERTER

[75] Inventor: Antonio Fernandez, Brooklyn, N.Y.

[73] Assignee: RCA Corporation, Princeton, N.J.

[21] Appl. No.: 720,946

[22] Filed: Apr. 8, 1985

[51] Int. Cl.[4] .......................................... H03M 00/00
[52] U.S. Cl. ............................................ 340/347 AD
[58] Field of Search ................ 340/347 AD, 347 CC, 340/347 C, 347 NT

[56] References Cited

U.S. PATENT DOCUMENTS 3,745,555 7/1973 Carbrey ..................... 340/347 AD
4,529,965 7/1985 Lee ............................. 340/347 AD Primary Examiner—Charles D. Miller Attorney, Agent, or Firm—E. M. Whitacre; P. J. Rasmussen; K. N. Nigon

[57] ABSTRACT

A successive approximation analog-to-digital converter (ADC) which uses pipeline processing techniques is disclosed. Each stage of the ADC uses a switched capacitor both as a sample and hold element and as a voltage subtracter. An analog potential is developed at terminal one of the capacitor and then the potential applied to the other terminal is changed by switching in or switching out a source of reference potential. The resulting analog value at the first end of the capacitor is the difference between the input value and reference potential. This value is applied to the next ADC stage. The polarity of this analog difference value determines the value of the digital bit signal produced by the stage.

7 Claims, 2 Drawing Figures

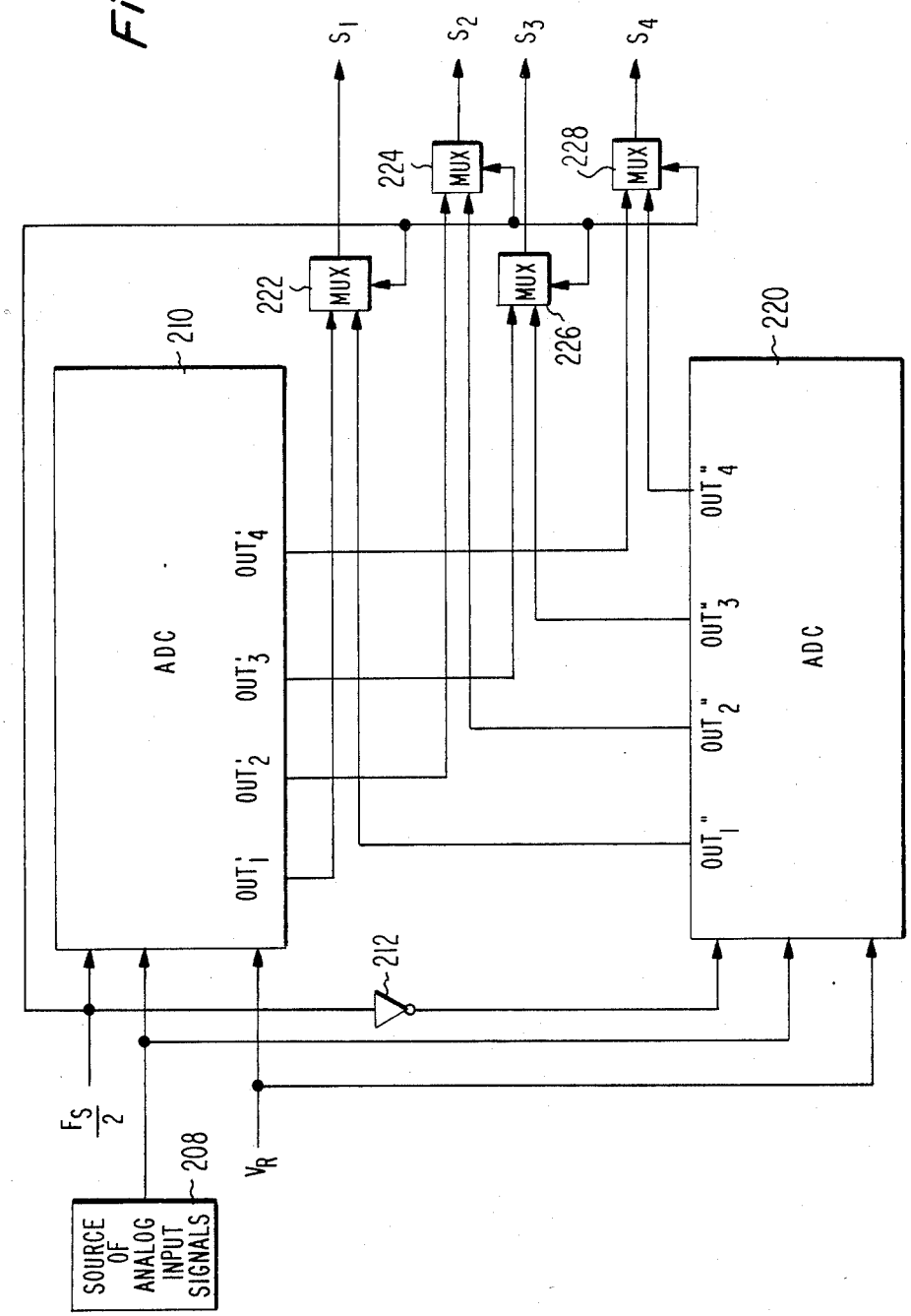

PIPELINED SUCCESSIVE APPROXIMATION ANALOG-TO-DIGITAL CONVERTER

The present invention relates to a successive approximation analog to digital converter (ADC) which employs pipeline processing techniques to achieve high conversion rates.

In many applications it is desirable to use an inexpensive ADC which produces high resolution digital samples at a relatively high rate. For example in a digital television receiver, where the cost of an ADC can contribute significantly to the cost of the product, it is desirable to use an ADC which provides eight-bit samples at rates from 10 to 18 MHz.

Flash ADC's are available which have suitable conversion rates and sample resolution These ADC's generate a digital sample from an analog value in one step. The analog value is compared to a large number of analog reference values and a digital sample is derived from the reference value which most closely approximates the analog value. Flash ADC's tend to be costly, however, because they require $2^N$ analog reference values and $2^N-1$ comparators to produce an N bit digital sample.

Pipelined successive approximation ADC's contain fewer components and can provide samples at rates comparable to flash ADC's. In a successive approximation ADC, each bit of the digital value is generated in a separate step, from the most significant bit (MSB) to the least significant bit (LSB). Each partial digital value represents a range of analog values which contains the analog value being processed. The upper limit of this range is defined by setting all of the unresolved bits to 1 and the lower limit is defined by setting the unresolved bits to zero. As an example of how a successive approximation ADC develops a digital value, consider applying the analog value 9 to a four-bit successive approximation ADC. The first step produces the partial binary value 1XXX (the X's indicate unresolved bits). This value defines the range of values from 8 to 15 as including the input analog value. In the next three steps the remaining bits are resolved producing the binary values 10XX, 100X and, finally, 1001 which is the binary representation of the number 9.

The N steps needed by a successive approximation ADC to produce an N-bit digital value can be reduced to an effective rate of one step per sample by pipeline processing techniques. In a pipelined successive approximation ADC, N separate stages are concatenated, each stage generating a particular bit of each digital value. At any given time, therefore, the ADC is processing N analog values. This yields an effective conversion rate of one digital sample per applied analog sample. However, there may be a delay of as many as N sample times between the time an analog value is applied to the ADC and the time its corresponding digital value is available at the output port of the ADC.

U.S. Pat. No. 3,599,204 entitled "Technique for High Speed Analog-to-Digital Conversion", which is hereby incorporated by reference, describes a possible implementation of a successive approximation ADC. Briefly, the device described in this reference employs N identical cascaded encoders each of which develops both a digital value, corresponding to one bit of the output digital value, and an analog value which is used by subsequent encoder stages to resolve the less significant bits of the digital value. Each encoder stage develops a logic zero if the analog value applied to its input port is less than a reference value and a logic one otherwise. Effectively, the encoders produce a logic zero if the input signal is less than one-half of the largest analog value which may be processed by the ADC and a logical 1 if the input signal equals or exceeds this value. The analog signal developed by each stage is equal to twice the difference between the analog value applied to the stage and one-half of the largest analog value which may be processed by the ADC.

To develop the analog values, each stage includes a times-two amplifier. If the gain of any of the amplifiers varies from two the encoder will pass erroneous analog values to the succeeding encoders, and consequently produce errors in the encoded binary output samples. Slight errors in the amplifier gain of the first or second encoder stages produce relatively large errors in the output samples. The requirement that the system include N amplifiers with precisely matched times-two gain factors renders this system difficult to manufacture in large quantities.

Another type of successive approximately ADC uses charge coupled devices and charge splitting or charge subtraction techniques to develop successively smaller analog values as each bit of the digital value is developed. An example of an ADC with these characteristics is shown in U.S. Pat. No. 4,136,335 entitled "Semiconductor Charge Coupled Device Analog to Digital Converter" which is hereby incorporated by reference. The ADC described in this reference develops digital samples having values proportional to the amount of charge in successive analog charge packets. Each encoder stage of this ADC develops a logic zero signal if the packet contains less than a reference amount of charge and a logic one signal otherwise. If a packet is found to contain more than the reference charge amount, the reference charge is subtracted from the packet before it is passed to the next subsequent stage. The reference charge amount for the initial encoder stage is one-half of the maximum charge which may be processed by the ADC. For each subsequent stage the reference charge amounts decrease by factors of one-half.

As with the previous ADC, each encoder stage of this ADC develops one-bit of a digital value. Consequently, an N-stage converter is needed to develop N-bit digital values and a pipeline processing techniques must be used to obtain conversion rates comparable to a flash ADC.

While this system does not use interstage amplifiers to develop successive bits, it does need charge to voltage converters. The sensitivity and tolerance of these converters define the accuracy of the system. These constraints tend to reduce the yield in the device manufacturing process and thus increase the fabrication cost of each good device.

SUMMARY OF THE INVENTION

The present invention is a pipelined successive approximation ADC which generates N bit digital values from analog voltage samples at the analog sample rate. The ADC includes N encoder stages and N corresponding geometrically decreasing voltage reference sources (N is an integer greater than or equal to 1). Each stage includes a switched capacitor which develops a potential substantially equal to the difference between the analog voltage applied to the stage and the reference voltage associated with the stage. This difference potential is applied to a comparator and to the next subsequent stage by a buffer amplifier. The comparator develops a logic high signal if the difference signal equals or exceeds a predetermined reference potential and develops a logic low signal otherwise. The comparator provides the digital output signal for the stage and controls the switching of the capacitor for the next subsequent stage.

BRIEF DESCRIPTION OF THE DRAWINGS

FIG. 2 is a block diagram of an alternative embodiment of the invention, having double the conversion rate of the embodiment shown in FIG. 1.

DETAILED DESCRIPTION

Figure 1:
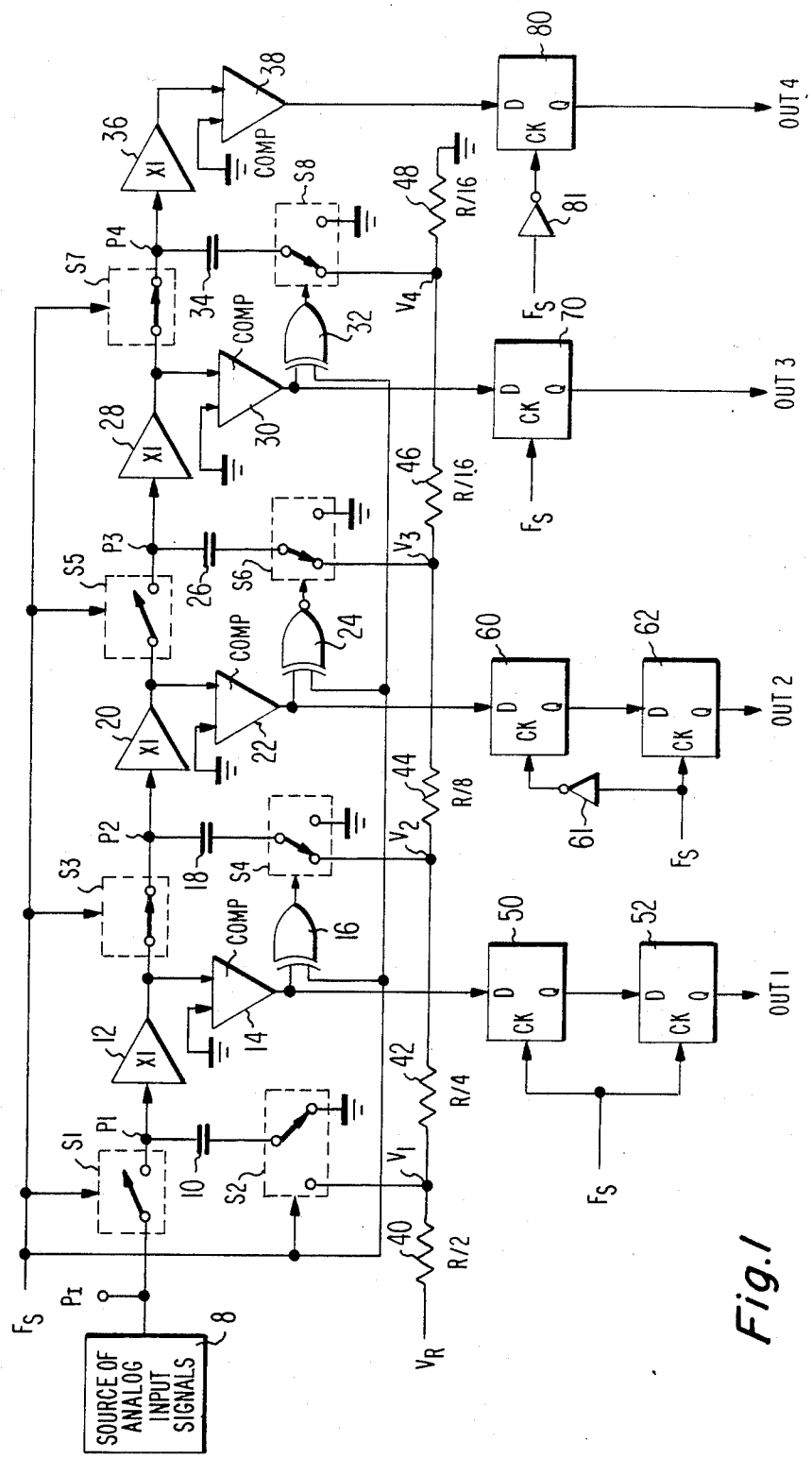
FIG. 1 is a schematic, partially in block diagram form, of a successive approximation analog-to-digital converter embodying the present invention.

The analog-to-digital converters shown in FIGS. 1 and 2 convert analog input signals into sequences of four-bit digital values. The invention is described in terms of a four-bit ADC to simplify the explanation of its operating principles. One skilled in the art of circuit design can build ADC's which provide digital samples having a larger number of bits by cascading further stages to the described embodiments according to the techniques taught herein.

Depending on the processing speed of the devices, compensating delays may be required in certain of the signal paths. One skilled in the art of digital circuit design would know where such delays would be needed in his particular system.

The ADC shown in FIG. 1 contains four stages. Each stage includes an encoder, a voltage reference source and a shift register. The operation and interaction of each of these components is described first in general terms and then in detail.

Each encoder generates a one-bit digital signal that is, for example, a logic one if the analog potential applied to its input port equals or exceeds the reference voltage associated with the stage and that is a logic zero otherwise. This digital signal is applied to the shift register as one bit of the digital value which represents the analog input potential. The one-bit digital signal also controls the encoder of the next subsequent stage of the ADC as explained below. The encoder of each stage subtracts the reference voltage from the analog potential applied to its input port to generate the analog input potential for the next stage.

The shift register portion of each stage delays the one-bit digital signal produced by the encoder until all of the other bits which describe the analog input value have been generated. Accordingly, the shift register for each stage of the ADC provides a larger delay than the shift register of the next stage. In the embodiment shown in FIG. 1, the shift registers of the first through fourth stages provide delays of 2, 1.5, 1 and 0.5 sample periods respectively.

Each stage of the ADC includes a reference voltage source. The reference voltage of the first stage is one-half of the largest analog potential which can be processed by the ADC. For each succeeding stage, the reference potential decreases by a factor of ½. In the four-bit ADC shown in FIG. 1, for example, the analog input potential may range between 0 and 16 volts. The reference voltages of the first through fourth stages (V1, V2, V3 and V4) are thus 8, 4, 2 and 1 volt respectively.

The ADC shown in FIG. 1 operates in synchronism with a sampling clock signal $F_s$ having a fifty-percent duty cycle. Each stage of the illustrated ADC uses one clock cycle to produce its partial result, however the clock cycles used by successive stages overlap on half-cycle boudaries. The detailed explanation below covers a period defined by three cycles of the $F_s$ clock signal. To simplify this explanation, these three clock cycles are broken up into six time periods, each corresponding to one-half cycle of the $F_s$ clock signal. In the first, third, and subsequent odd-numbered time periods the clock signal $F_s$ is in a logic high state, and in the second, fourth, and subsequent even numbered time periods the clock signal is in a logic low stage. When $F_s$ is high, switches S1 and S5 are closed and switches S3 and S7 are open. When $F_s$ is low, switches S1 and S5 are open and switches S3 and S7 are closed.

The encoder of the first stage of the ADC shown in FIG. 1 includes switches S1 and S2, capacitor 10, unity gain amplifier 12, comparator 14 and exclusive-OR (XOR) gate 16. Switch S1 is a normally open switch that is controlled by the sampling clock signal $F_s$. Switch S1 is coupled between a source of analog input signals 8 and the first terminal of capacitor 10. The switch S2 connects the second terminal of capacitor 10 to a source of reference potential, $V_1$, when $F_s$ is in a logic high state and to a source of constant potential (e.g. ground) when $F_s$ is in a logic low state. In the embodiments described below, $V_1$ and all other potentials are measured relative to ground to simplify the explanation of the embodiments. The reference potential $V_1$ in this embodiment is substantially equal to one-half of $V_{max}$, the maximum analog signal level which may be processed by the ADC.

During the first, third and subsequent odd numbered time periods $F_s$ is in a logic high stage, switch S1 is closed and switch S2 connects the second terminal of capacitor 10 to reference potential $V_1$. During these time periods capacitor 10 charges or discharges until the potential, $P_1$, at its first terminal is substantially equal to the input signal potential, PI. $P_1$ is actually the sum of two potentials, the reference potential, $V_1$, and the potential stored in the capacitor 10.

During the second time period, $F_s$ changes to a logic low state, causing switch S1 to open and switch S2 to connect the second terminal of capacitor 10 to ground. The potential $P_1$ changes to the potential that was stored across the capacitor during the first time period. This potential is the difference between the input potential PI and the reference potential $V_1$. If, during the first time period, PI is greater than $V_{max}/2$, then $P_1$ is positive, and if PI is less than $V_{max}/2$, then $P_1$ is negative.

Unity gain amplifier 12 is coupled to the first terminal of capacitor 10 and provides a potential substantially equal to $P_1$ to one input terminal of comparator 14 and, via switch S3, to the capacitor 18 of the second stage of the ADC. Amplifier 12 desirably has a high input impedance and a low output impedance so that its input connection does not significantly discharge capacitor 10 and so that ample current is provided at its output connection to charge capacitor 18 quickly.

The second input terminal of comparator 14 is connected to ground. The comparator 14 develops a logic high output signal when the level of the signal provided by amplifier 12 equals or exceeds ground potential and it develops a logic low output signal when the signal provided by amplifier 12 is less than ground potential. During the latter part of the second and the early part of the third time periods, this signal is applied to the shift register portion of the first ADC stage (i.e. flip-flops 50 and 52) and to one input terminal of the XOR gate 16.

The sampling clock signal $F_s$ is applied to the second input terminal of XOR gate 16. When $F_s$ is in a logic low state, the XOR gate 16 applies the signal provided by comparator 14 to the control input terminal of switch S4. However, when $F_s$ is in a logic high state, the XOR gate 16 applies the logical complement of the signal from comparator 14 to switch S4. Consequently, if $P_1$ equals or exceeds ground potential and $F_s$ is in a logic low state, switch S4 connects the second terminal of capacitor 18 to reference potential $V_2$ (which in the present embodiment is $V_{max}/4$). But, if $P_1$ is less than ground potential when $F_s$ is in a logic low state switch S4 connects the second terminal of capacitor 18 to ground. In either case, when $F_s$ changes to a logic high state switch S4 reverses its position.

At the start of the second time period switch S3 couples the potential $P_1$ from amplifier 12 to the first terminal of capacitor 18. The potential $P_2$, at the first terminal of capacitor 18 increases or decreases until it substantially equals $P_1$. At the start of the third time period switch S4 reverses its position so that potential $P_2$ changes by an amount substantially equal to $+V_2$ or $-V_2$ depending on whether $P_1$ is less than ground potential or greater than or equal to ground potential respectively.

Unity gain amplifier 20, which may be identical to amplifier 12, is connected to the first terminal of capacitor 18 to provide a potential substantially equal to $P_2$ to one input terminal of comparator 22 and to the third stage of the ADC. Comparator 22 functions identically to comparator 14; it provides a logic high output signal if potential $P_2$ equals or exceeds ground potential and provides a logic low output signal otherwise. During the second half of the third time period and the first half of the fourth time period, this output signal is applied to the shift register for the second stage (i.e. flip-flops 60 and 62), and to one input terminal of the exclusive NOR (XNOR) gate 24.

The sampling clock signal $F_s$ is coupled to the second input terminal of XNOR 24. When $F_s$ is a logic high, the signal provided by XNOR 24 is the same as the output signal of comparator 22. However, when $F_s$ changes to a logic low, the signal at the output of XNOR 24 changes to the logical complement of the output signal of comparator 22. The output signal of XNOR 24 controls switch S6.

At the start of the third time period, a potential substantially equal to $P_2$ is available at the output terminal of amplifier 20. Switch S5 is closed and potential $P_2$ is applied to the first terminal of capacitor 26. The second terminal of capacitor 26 is connected via switch S6 either to ground or to the reference potential $V_3$ (e.g. $V_{max}/8$), depending on whether potential $P_2$ is less than or greater than or equal to ground potential respectively. During this third time period, the potential, $P_3$, at the first terminal of capacitor 26 increases or decreases until it substantially equals $P_2$. When $F_s$ changes to a logic low state (the fourth time period), switch S5 opens and switch S6 changes position, changing $P_3$ by an amount substantially equal to the reference potential $V_3$ as explained above in reference to switches S2 and S4.

Unity gain amplifier 28, which may be identical to amplifiers 12 and 20, is coupled to the first terminal of capacitor 26 and applies a potential substantially equal to $P_3$ to one input terminal of comparator 30 and to the fourth stage of the ADC. As with comparators 14 and 22, the second input terminal of comparator 30 is coupled to ground. Comparator 30 generates a logic high output signal when $P_3$ equals or exceeds ground potential and a logic low output signal otherwise. During the end of the fourth and start of the fifth time period this signal is applied to the shift register portion of the third stage of the ADC (i.e. flip-flop 70), and to one input terminal of XOR gate 32. The second input terminal of XOR gate 32 is connected to the sampling clock signal $F_s$. XOR gate 32 controls switch S8 of the fourth stage of the ADC.

During the fourth time period switch S7 passes a potential substantially equal to $P_3$ to the first terminal of capacitor 34. At this time, switch S8 connects the second terminal of capacitor 34 either to ground or to the reference potential $V_4$, which in the present embodiment is $V_{max}/16$, depending on whether $P_3$ is less than, or is greater than or equal to ground potential respectively. In the fourth time period, capacitor 34 charges or discharges until the potential $P_4$ substantially equals $P_3$. At the start of the fifth time period, switch S7 opens and switch S8 changes position causing potential $P_4$ to change by an amount substantially equal to reference potential $V_4$. Unity gain amplifier 36 is coupled to the first terminal of capacitor 34 and during the fifth time period it provides a potential substantially equal to $P_4$ to one input terminal of comparator 38. Comparator 38 provides a logic high output signal to the shift register portion of the fourth ADC stage (flip-flop 80) when $P_4$ equals or exceeds ground potential, and provides a logic low signal otherwise. This signal is available during the second half of the fifth and first half of the sixth time periods.

As an aid to understanding the operation and interaction of all of the encoder stages, consider the example set forth in Table 1. In this example, $V_{max}$ is 16 volts and the analog value applied to the ADC is 9.1 volts. The columns of the table correspond to the time periods $T_1$ through $T_6$ and the rows show the values of various signals during conversion of the analog value. The values of digital signal are shown as H corresponding to a logic high state and L corresponding to a logic low state.

TABLE

|  | $T_1$ | $T_2$ | $T_3$ | $T_4$ | $T_5$ | $T_6$ |
|---|---|---|---|---|---|---|
| $F_s$ | H | L | H | L | H | L |
| PI | 9.1 | | | | | |
| $P_1$ | 9.1 | 1.1 | | | | |
| COMP 14 | | H | H | | | |
| XOR 16 | | H | L | | | |
| $P_2$ | | 1.1 | −2.9 | | | |
| COMP 22 | | | L | L | | |
| XOR 24 | | | L | H | | |
| $P_3$ | | | −2.9 | −0.9 | | |
| COMP 30 | | | | L | L | |
| XOR 32 | | | | L | H | |
| $P_4$ | | | | −0.9 | 0.1 | |
| COMP 38 | | | | | H | H |

The digital value which represents the 9.1 volt analog input potential can be obtained by combining the individual bits provided by comparators 14, 22, 30 and 38 at the start of time periods $T_3$, $T_4$, $T_5$, and $T_6$ respectively. From the Table 1, these values are H, L, L and H. If H corresponds to the binary number 1 and L to binary 0, the digital representation of the 9.1 volt analog input signal is 1001 which is the binary representation of the decimal number 9.

The digital bit signals from the four encoders of the ADC are available at the output terminals of the comparators 14, 22, 30 and 38 at the start of time periods 3, 4, 5 and 6 respectively. Since each time period corresponds to one-half cycle of the clock signal $F_s$, the delay for each of these digital bit signals relative to the application of the analog sample which it represents is 1, 1.5, 2, and 2.5 cycles of the sampling clock signal respectively. To present these signals as a single digital value which may be accessed coincident with the leading edge of an $F_s$ clock pulse, the bit signals provided by comparators 14, 22, 30 and 38 are delayed via clocked shift registers by 2, 1.5, 1 and 0.5 cycles of the $F_s$ clock signal respectively.

The shift register portion of the first stage of the ADC includes the leading-edge-triggered D flip-flops 50 and 52. The single bit digital signal developed by comparator 14 is applied to the D input terminal of flip-flop 50. The Q output terminal of flip-flop 50 is connected to the D input terminal of flip-flop 52. The clock input terminals of flip-flops 50 and 52 are connected to receive the sampling clock signal $F_s$. On the leading edge of an $F_s$ clock pulse, the signal at the output of comparator 14 is latched into the flip-flop 50. The leading edge of the next clock pulse transfers this value into flip-flop 52. This value is available at the Q output terminal of flip-flop 52 coincident with the leading edge of the next clock pulse, two clock periods after it was latched into flip-flop 50.

The shift register portion of the second ADC stage includes the leading-edge-triggered D flip-flops 60 and 62. The output terminal of comparator 22 is connected to the D input terminal of flip-flop 60 and the Q output terminal of flip-flop 60 is connected to the D input terminal of flip-flop 62. The clock input terminal of flip-flop 60 is connected to receive an inverted version of the clock signal $F_s$ through inverter 61 while the clock input terminal of flip-flop 62 is connected to receive a non-inverted $F_s$. On the trailing edge of an $F_s$ clock pulse, flip-flop 60 latches the value applied by comparator 22. On the leading edge of the next clock pulse, this value is transferred to flip-flop 62. Accordingly, the flip-flops 60 and 62 delay the single-bit digital signals by one and one-half cycles of the $F_s$ clock signal.

The shift register portions of the third and fourth ADC stages are respectively the single leading-edge-triggered D flip flops 70 and 80. The D input terminal of flip flop 70 is connected to the output terminal of comparator 30, and its clock input terminal is coupled to receive $F_s$. Single bit digital samples provided by comparator 30 are thus delayed one $F_s$ clock period by flip-flop 70. The D input terminal of flip-flop 80 is coupled to the output terminal of comparator 38. The clock input terminal of flip-flop 80 is coupled to receive an inverted $F_s$ through inverter 81. The single bit digital values provided by comparator 38 are latched into flip-flop 80 on the trailing edge of an $F_s$ clock pulse and are available at the Q output terminal of flip-flop 80 coincident with the leading edge of the next $F_s$ clock pulse. Consequently, flip-flop 80 provides a one-half clock cycle delay.

Four bit digital values are available at the Q output terminals of flip-flops 52, 62, 70 and 80 coincident with the leading edge of each $F_s$ clock pulse. These digital values represent analog levels that were applied to the input of the ADC three clock periods earlier. The signal, OUT1, provided by flip-flop 52 is the most significant bit of the digital values and the signals OUT2, OUT3 and OUT4 provided respectively by the flip-flops 62, 70 and 80 are the three successive less significant bits of the digital values.

The reference potentials for the encoder stages are developed by a voltage divider formed by the series connected chain of resistors 40, 42, 44, 46 and 48. At one end of the chain, resistor 40 is connected to a source of reference potential, $V_{max}$, which is substantially equal to the largest analog potential which may be processed by the ADC. At the other end of the chain, resistor 48 is connected to ground. The total resistance across the chain is R; resistors 40, 42, 44, 46, and 48 have resistances of R/2, R/4, R/8, R/16 and R/16 respectively. Reference potential $V_1$ is taken at the junction of resistors 40 and 42. Since the resistance on either side of this point is substantially equal to R/2, $V_1$ is substantially equal to $V_{max}/2$. By similar analysis, the reference potential $V_2$ at the junction of resistors 42 and 44 is substantially equal to $V_{max}/4$, the reference potential $V_3$ at the junction of resistors 44 and 46 is substantially $V_{max}/8$ and the potential $V_4$ at the junction of resistors 46 and 48 is substantially $V_{max}/16$.

The digital value developed by each encoder stage depends on the difference between an input potential and a reference potential. This potential difference is substantially independent of the values of the capacitors and of the amount of charge stored on each capacitor. Accordingly, the capacitors used by this ADC may be designed and produced with relatively wide tolerances.

The encoder stages described above each includes a unity gain interstage amplifier. Gain errors in these amplifiers combine additively, not multiplicatively as with the times-two amplifiers shown in U.S. Pat. No. 3,599,204, described above. To achieve a predetermined conversion accuracy, therefore, the unity gain amplifiers may be designed and built with wider tolerances than the corresponding times-two amplifiers.

FIG. 2 is a block diagram of an ADC which employs two ADC's similar to the one shown in FIG. 1 to obtain a conversion rate that is twice the rate of a single ADC. The two ADC's, 210 and 220 are coupled to a source of analog samples 208 and to a source of reference potential $V_{max}$. Analog samples are applied simultaneously to both ADC's with a sample frequency of $f_s$. ADC 210 is coupled to receive a clock signal $F_s/2$, having a frequency that is one-half $f_s$. The signal $F_s/2$ is shifted 180° in phase by inverter 212 and applied to the clock input terminal of ADC 220. Analog samples which occur coincident with the leading edges of the $F_s/2$ clock pulses are processed by ADC 210 into digital samples which are available at the output terminals OUT$_1'$ through OUT$_4'$ of ADC 210, also coincident with the leading edges of the $F_s/2$ clock pulses. Similarly, the analog samples which occur coincident with the trailing edges of the $F_s/2$ clock pulses are processed by ADC 220 into digital samples which are available at the output terminals OUT$_1''$ through OUT$_4''$ of ADC 220 coincident with the trailing edges of $F_s/2$. Output terminals OUT$_1'$ and OUT$_1''$ of ADC's 210 and 220 respectively are connected to the two data input terminals of multiplexer 222. Similarly, output terminals OUT$_2'$ and OUT$_2''$ are coupled to the two data input terminals of multiplexer 224; the output terminals OUT$_3'$ and OUT$_3''$, to the two data input terminals of multiplexer 226; and the output terminals OUT$_4'$ and OUT$_4''$, to the two data input terminals of multiplexer 228. The control input terminals of multiplexers 222, 224, 226 and 228 are coupled to receive the clock signal $F_s/2$. Each of the multiplexers 222, 224, 226 and 228 is configured to pass the signal from ADC 210 (OUT$_1'$, OUT$_2'$, OUT$_3'$ and OUT$_4'$) when $F_s/2$ is in a logic high state and to pass the signal from ADC 220 (OUT$_1''$, OUT$_2''$, OUT$_3''$ and OUT$_4''$) when $F_s/2$ is in a logic low state. The digital values developed by the multiplexers 222, 224, 226 and 228 are available as signals $S_1$, $S_2$, $S_3$ and $S_4$ respectively.

Since each of the ADC's 210 and 220 operates with a clock frequency that is one-half of the sampling clock frequency $f_s$, the ADC which includes both ADC's 210 and 220 can process samples at substantially twice the rate of the ADC shown in FIG. 1.

While the ADC's 210 and 220 are shown as having separate reference potential input terminals coupled to separate voltage dividing resistor chains, it is contemplated that a single reference potential and voltage divider resistor chain may be used for both ADC's 210 and 220. It is further contemplated that, by generating appropriately phased clocks, more ADC's can be coupled in parallel to obtain higher conversion rates.

What is claimed is:

1. An analog-to-digital converter comprising:
    a terminal for applying an analog signal which may range between predetermined minimum and maximum values;
    means for providing a sampling clock signal;
    a first capacitor having first and second terminals;
    first means responsive to said sampling clock signal for sequentially coupling the analog signal to the first terminal of said first capacitor to develop a first sequence of samples at the first terminal of said first capacitor, the samples of said first sequence having values which correspond to the instantaneous potential of said analog signal at times determined by said sampling clock signa;
    first sqitching means for alternately coupling a source of first reference potential and a source of constant potential to the second terminal of said first capacitor to develop a second sequence of samples interleaved among the samples of said first sequence at the first terminal of said first capacitor, the values of the samples of said second sequence corresponding substantially to the difference between the corresponding samples of said first sequence and said first reference potential relative to said constant potential;
    first comparison means coupled to the first terminal of said first capacitor and to said source of constant potential for developing a digital signal which is in a first state when a sample of said second sequence is greater than or equal to said constant potential and which is in a second state otherwise;
    a second capacitor having first and second terminals;
    second means responsive to said sampling clock signal for sequentially coupling the first terminal of said first capacitor to the first terminal of said second capacitor to develop a third sequence of samples at the first terminal of said second capacitor, the samples of said third sequence having values which are substantially equal to the samples of said second sequence;
    second switching means responsive to a control signal for selectively coupling a source of second reference potential and said source of constant potential to the second terminal of said second capacitor to develop a fourth sequence of samples interleaved among the samples of said third sequence at the first terminal of said second capacitor, the samples of said fourth sequence corresponding substantially to the difference between the corresponding samples of said third sequence and said second reference potential relative to said constant potential;
    means responsive to said sampling clock signal and to the digital signal provided by said first comparison means for developing the control signal for said second switching means;
    second comparison means coupled to the first terminal of said second capacitor and to said source of constant potential for developing a digital signal which is in a first state when a sample of said fourth sequence is greater than or equal to said constant potential and which is in a second state otherwise.

2. The analog-to-digital converter set forth in claim 1 wherein:
    said first comparison means comprises:
        a first amplifier coupled to the first terminal of said first capacitor for developing samples having values substantially equal to the values of the samples of said second sequence for application to the first terminal of said second capacitor; and
        a first comparator coupled to said first amplifier and to said source of constant potential for developing a digital signal which is in a first state when a sample provided by said first amplifier is greater than or equal to said constant potential and which is in a second state otherwise; and
    said second comparison means comprises:
        a second amplifier coupled to the first terminal of said second capacitor for developing samples having values substantilly equal to the values of the samples of said fourth sequence; and
        a second comparator coupled to said second amplifier and to said source of constant potential for developing a digital signal which is in a first state when a sample provided by said second amplifier is greater than or equal to said constant potential and which is in a second state otherwise.

3. The analog-to-digital converter set forth in claim 2 wherein:
    the gain of said first and second amplifiers is substantially equal to unity;
    said first reference potential is substantially equal to one-half of the difference between the predetermined maximum and minimum values of said analog video signal; and
    said second reference potential is substantially equal to one-half of said first reference potential.

4. A successive approximation analog-to-digital converter comprising:
    a source of a plurality of reference potentials having successively descending values;
    a source of clock signal having first and second states;
    a source of constant potential;
    a plurality of similar sampling/comparing stages, connected in cascade, each stage including:
        an input terminal for applying an analog potential;
        analog and digital output terminals for providing an analog output potential and a digital output signal respectively, wherein the analog output terminal of each stage is connected to be input terminal of the next succeeding stage;
        a capacitor having first and second terminals;

first switching means, responsive to said clock signal for alternately coupling a potential applied to said input terminal to the first terminal of said capacitor;

second switching means, responsive to a control signal for alternately coupling one of said reference potentials and said constant potential to the second terminal of said capacitor;

means coupled to the first terminal of said capacitor for developing a digital signal at said digital output terminal having one state when the potential at the first terminal of said capacitor equals or exceeds a predetermined value and a second state otherwise;

control signal generating means coupled to said source of clock signal and to the digital output terminal of the immediately preceding stage for generating a control signal to condition said second switching means to alternately couple said one reference potential and said constant potential to the second terminal of said capacitor wherein the one reference potential is coupled to the second terminal when the clock signal and the digital signal provided by the digital output terminal of said immediately preceding stage occur in the same state in ones of the stages, and the one reference potential is coupled to the second terminal when the clock signal and the digital signal occur in opposite states in alternate ones of the stages.

5. The analog-to-digital converter set forth in claim 4 wherein said digital signal developing means comprises:

an amplifier coupled to be first terminal of said capacitor for providing an output signal proportional to the value of the potential at the first terminal of said capacitor; and a comparator having first and second input terminals coupled to said amplifier and to said source of constant potential respectively and an output terminal coupled to said digital output terminal for developing an output signal having a first state when the signal provided by said amplifier is greater than or equal to said constant potential and having a second state otherwise.

6. The analog-to-digital converter set forth in claim 5 wherein said amplifier has a gain substantially equal to unity.

7. The analog-to-digital converter set forth in claim 4 wherein said control signal generating means comprises an exclusive-or gate in said ones of said stages and comprises an exclusive-nor gate in said alternate ones of said stages.

* * * * *